United States Patent [19]

deBuda et al.

[11] 4,384,357
[45] May 17, 1983

[54] SELF-SYNCHRONIZATION CIRCUIT FOR A FFSK OR MSK DEMODULATOR

[75] Inventors: Rudi deBuda; Charles E. Jagger, both of Toronto, Canada

[73] Assignee: Canadian Patens & Development Limited, Ottawa, Canada

[21] Appl. No.: 250,757

[22] Filed: Apr. 3, 1981

[51] Int. Cl.³ .................. H03D 3/18; H03D 3/24
[52] U.S. Cl. ........................... 375/81; 375/90; 329/50; 329/124; 455/208
[58] Field of Search ...................... 375/78–83, 375/94, 97, 111, 113, 119, 120, 90; 455/201, 202, 205, 207, 208, 210, 260; 329/50, 122, 124; 328/63, 72

[56] References Cited

U.S. PATENT DOCUMENTS

| | | | |
|---|---|---|---|
| 3,710,261 | 1/1973 | Low et al. | 375/81 |
| 3,769,589 | 10/1973 | Buntschuh et al. | 375/94 |
| 3,806,815 | 4/1974 | Fletcher et al. | 329/122 |
| 3,984,778 | 10/1976 | Bhopale | 375/81 |
| 4,057,762 | 11/1977 | Namiki | 455/208 |
| 4,143,322 | 3/1979 | Shimamura | 375/81 |
| 4,188,589 | 2/1980 | Brown et al. | 329/122 |
| 4,213,096 | 7/1980 | Daniel, Jr. | 455/260 |
| 4,314,206 | 2/1982 | Attwood et al. | 329/124 |
| 4,324,001 | 4/1982 | Rhodes | 375/106 |

Primary Examiner—Benedict V. Safourek
Assistant Examiner—Stephen Chin
Attorney, Agent, or Firm—Edward Rymek

[57] ABSTRACT

The self-synchronization circuit splits the incoming signal into two circuit paths where the signals are frequency shifted by a frequency signal equal to the carrier frequency so as to provide an in-phase signal in one circuit path and a quadrature signal in the other circuit path. The frequency shifting circuit includes at least a controllable oscillator. The output of a first multiplier which multiplies the in-phase and quadrature signals, is fed to a clock recovery circuit which determines the clock frequency. A second multiplier multiplies the output of the first multiplier with the clock recovery circuit output to provide a signal which controls the controllable oscillator. In addition, a frequency discriminator utilizes the in-phase and quadrature signals to initially coarse control the controllable oscillator frequency. The frequency shifting signals may be obtained from the controllable oscillator feeding phase shifting circuits, or they may be obtained from a combined circuit including a fixed oscillator with phase shifting circuits together with the controllable oscillator and appropriate mixing circuits.

4 Claims, 2 Drawing Figures

SELF-SYNCHRONIZATION CIRCUIT FOR A FFSK OR MSK DEMODULATOR

BACKGROUND OF THE INVENTION

This invention relates to a special Frequency Shift Keying (FSK) system that is known as the "Fast FSK", and in particular it provides an improved self-synchronizing receiver for demodulating "Fast FSK" radio signals.

The "Fast FSK" system uses a phase continuous FSK modulator where the two keyed frequencies differ by one half the bit rate. This modulation method is particularly suitable for the transmission of digital data over a noisy radio channel whose channel bandwidth is between 0.6 times and 0.9 times the bit rate of the data. For optimal demodulation of the data, coherent demodulation of an in-phase and of a quadrature channel is a necessity. In turn, coherent demodulation requires self-synchronization circuits for recovery of the clock reference signal and the r.f. carrier reference signal of correct frequency and phase. These reference signals are conventionally derived after a frequency doubling stage, as described in Canadian Pat. No. 1,066,371 entitled "Demodulator For Frequency-Shift Keying System" which was issued on Nov. 13, 1979 to R. de Buda, assignee to Canadian General Electric Company Limited.

A modulation system with similar properties as the Fast FSK system is the MSK system described in the publication "The Effect of Tandem Band and Amplitude Limiting on the $E_b/N_o$ Performance of MSK" by H. R. Mathwich et al, IEEE Transactions Communications, Vol. COM-22, pp 1525-1540, October 1974. While the MSK system modulates a particular message differently, a random data stream creates for the MSK system the same power spectrum as for the Fast FSK system, and therefore, the same self-synchronization circuits can be used for either system. Hence, and without further reference, all the description which will be given for self-synchronization of the Fast FSK system should be understood to apply also to the self-synchronization of the MSK system.

Self-synchronization recovers the suppressed carrier from a signal in which all the transmitted power is used to transmit the messages so that the receiver must recover the carrier reference signal from the messages. Before carrier recovery has taken place, the messages must be considered as random data. Now it is known that random data, as transmitted by the Fast FSK system, represents a statistical process that has a continuous spectrum, and that such an unprocessed continuous spectrum is not suitable for carrier recovery, for which spectral lines are needed.

A bounded linear transformation of such a process having a continuous spectrum cannot give one with a line spectrum. Therefore, linear transformations alone (and this would include any combination of delays, multiplications with a fixed function, e.g. gating, and all filters) are not suitable for providing a spectrum from which self-synchronization can be achieved.

This shows that any method that can recover carrier and clock reference signals from a random data modulated Fast FSK, cannot be linear but must contain some non-linear circuit. A practical, simple and efficient method of providing such a non-linear circuit is to frequency double the signal in the self-synchronizing stage as described in the above Canadian Pat. No. 1,066,371 because, as it has been noted in the paper "Coherent Demodulation of FSK with Low Deviation Ratio", by R. de Buda, IEEE Transactions Communications, Vol. COM-20, pp. 429-435, the spectrum at the output of the frequency doubler contains two components: one is a continuous spectrum, the other a line spectrum with lines at frequencies $2f_s$ and $2f_m$ when the Fast FSK alternates randomly between the "mark" frequency $f_m$ and the "space" frequency $f_s$, ($f_s > f_m$). Two phase locked loops can now be used to extract the two lines from the frequency doubler output. The frequency doubling circuit in this case is then that non-linear circuit which, as discussed above, is an essential part of the self-synchronization circuits.

The oscillators in the phase-locked loops may be at $2f_s$, and $2f_m$ but other combinations of oscillator frequencies are also possible. In particular, it may be of advantage to have one oscillator at $f_s + f_m$ and the other at $f_s - f_m$, (which is a much lower frequency) and then to compare the output of the doubler with that of a mixer having the two oscillator signals as inputs and generating reference signals at:

$(f_s + f_m) \pm (f_s - f_m) = 2f_s$ and $2f_m$. More complex frequency plans are possible. Also, it is not required to frequency double the incoming r.f. signal, which may be quite impractical, but the incoming signal could first be frequency shifted to a useful i.f. and there frequency doubled. If f is the frequency of the incoming signal and $f_o$ is the frequency of the local oscillator that is employed for frequency shifting to the i.f., then the above can be summarized by the identity:

$2(f - f_o) = 2f - 2f_o$, i.e. first frequency shifting by $f_o$ and then doubling is the same as first doubling and then frequency shifting by $2f_o$. These comments are included only for completeness of the description. They are state of-the-art and not novel.

In previously used circuitry, the frequency doubling is usually performed by a diode with square-law characteristic, or by a linear multiplier with the same signal applied to both inputs. In either case, second harmonics are generated as indicated by the identity: $2\cos^2\omega t = 1 + \cos 2\omega t$. A zonal filter rejects the dc and low frequency parts of the output and retains the second harmonic.

If however, the self-synchronization circuits are not designed with analog circuit elements, and the restriction is added that the circuit should be built mainly from logic gates, then it is found that many of the circuit elements can be readily replaced by gates alone. After all, any FSK signal is a constant amplitude signal, and the hard limiting which the gates provide retains the phase information.

However, the square of a hard limited signal is useless for this purpose, because it does not generate a second harmonic, since $(-1)^2 = 1$, and a different self-synchronization method must be provided.

SUMMARY OF THE INVENTION

It is therefore an object of the present invention to provide a non-linear self-synchronization circuit for a Fast FSK or MSK demodulator which provides the carrier reference signal and can be implemented with an improved circuit requiring only logic gates.

These and other objects are achieved in a self-synchronization circuit for a receiver that demodulates an incoming Fast FSK or MSK signal. The circuit includes a local oscillator circuit for frequency shifting the incoming signal by two outputs 90° apart resulting in one in-phase and one quadrature signal; and a multiplier responsive to the in-phase and quadrature signals for effectively producing a frequency doubled signal for recovering a clock reference signal and for controlling the local oscillator circuit to provide a carrier reference signal.

In accordance with another aspect of this invention, the self-synchronization circuit for the demodulating receiver has two circuit paths. The incoming signal is coupled into the two circuit paths where it is frequency shifted by a frequency signal substantially equal to the carrier frequency so as to have an in-phase signal in one circuit path and a quadrature signal in the other circuit path. The frequency shifting circuit includes at least one oscillator controllable in frequency. A first multiplier circuit multiplies the in-phase and quadrature signals, a clock recovery circuit determines the clock frequency from the output of the first multiplier, and a second multiplier multiplies the output of the first multiplier and the clock recovery circuit to provide a control signal to the controllable oscillator.

In accordance with a further aspect of the invention, a frequency discriminator utilizes the in-phase and quadrature signals to control the controllable oscillator frequency to improve the initial signal acquisition time for carrier frequency offsets relative to the controllable oscillator frequency.

In accordance with another aspect of this invention, the frequency shifting signals may be obtained from the controllable oscillator feeding phase shifting circuits, or they may be obtained from a combined circuit including a fixed oscillator with phase shifting circuits together with the controllable oscillator and the appropriate mixing circuits.

Many other objects and aspects of the invention will be clear from the detailed description of the drawings.

DETAILED DESCRIPTION

Figure 1:
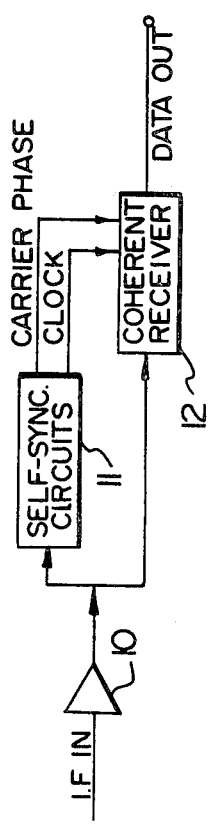
FIG. 1 is a schematic of a Fast FSK demodulator.

As illustrated in FIG. 1, the received i.f. signal is amplified in amplifier 10 and directed to both a self-synchronization circuit 11 and a coherent receiver 12. The self-synchronization circuit 11 operates on the input signal to provide a clock signal at rate 1/T, where T is the signalling interval and a carrier reference signal with phase information, to a coherent receiver 12 where the i.f. signal is demodulated to provide the data output.

Figure 2:
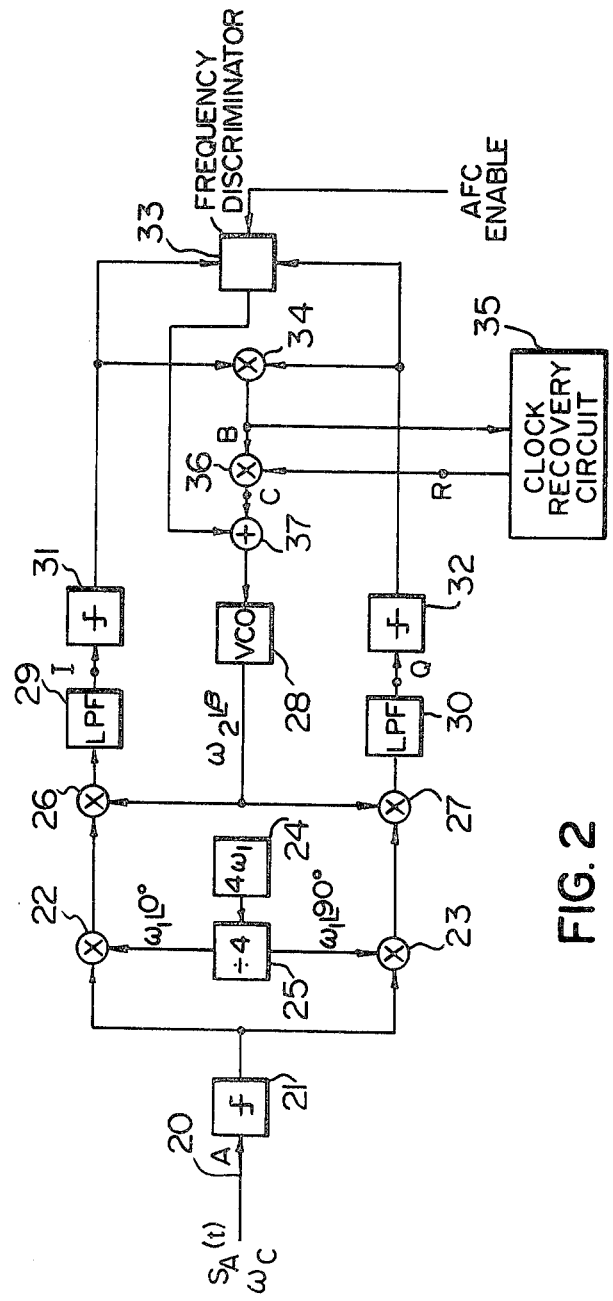
FIG. 2 is a schematic of the carrier recovery circuit in accordance with the present invention.

In the carrier recovery circuit shown in FIG. 2, the Fast FSK signal $s_A(t)$ which is on a suitable i.f. carrier $\omega_c$ is applied to the input port 20. A hard limiter 21 hard limits the signal which is then directed along two paths. The signal in each path is fed to a first mixer or down converter 22, 23. The second inputs to the down converter 22, 23 are two sinusoids with the same angular frequency $\omega_1$ but in phase quadrature to one another. Using the convention that $\omega/\alpha$ denotes a sinusoid of (angular) frequency $\omega$, and phase $\alpha$, the two sinusoids are $\omega_1/0°$ and $\omega_1/90°$.

In a digital circuit as shown in FIG. 2, the two phases would be generated from a source 24 at angular frequency $4\omega_1$ and a frequency divider 25 to divide by 4.

Analog circuits would normally start with a sinusoid $\omega_1/45°$ fed into $\pm 45°$ phase shifters, for the same result.

The outputs of the down converters 22 and 23 are sent into a second pair of down converters 26 and 27. The second inputs of both 26 and 27 are fed by the same sinusoid $\omega_2/\beta$. This sinusoid is obtained from voltage-controlled oscillator (VCO) 28 whose control will be described below.

The outputs of the down converters 26 and 27 are fed through low pass filters 29 and 30 in the two paths. The values of the angular frequencies $\omega_1$ and $\omega_2$ have been selected in relation to $\omega_c$ such that the down converted signals at points I and Q are baseband signals. Other filters that are normally part of a down conversion have been omitted from the diagram for simplicity.

The circuit shown in FIG. 2 is only one of several possible circuits useful for generating from $s_A(t)$ the signals I and Q, which combine to the complex signal $I+jQ$, from which $s_A(t)$ can be recovered. For example, converters 22, 23, divider 25 and oscillator 24 can be eliminated if a VCO 28 at frequency $\omega_2 \approx \omega_c$ is available and if 90° phase shifts of this signal can be implemented.

In FIG. 2, the signals at I and Q are next hard limited by limiters 31 and 32 and are fed to two circuits: a frequency discriminator 33 and a mixer 34. It is the purpose of the frequency discriminator 33 to provide a control signal which sets the frequency of the oscillator 28 that is initially free running, into the vicinity of the value $\omega_2$ on which it will later lock.

The frequency discriminator 33 is a digital implementation of the principle that ½ the number of zero crossings per second is equal to the spectrally weighted average of the frequencies of the incoming process. By deriving an error signal from the difference of this weighted average and the VCO 28 that is controlled by the error, the feedback sets the VCO 28 in accordance with the centre frequency of the filter 29, 30 as long as the signal in the filter 29, 30 is only noise, and when Fast FSK is received, the VCO 28 is in accordance with half the spectral weighted average frequency of the frequency doubled Fast FSK signal.

This average frequency must be between $f_m$ and $f_s$. As soon as the VCO 28 is phase locked to the incoming signal, the frequency discriminator 33 is no longer needed. For practical reasons, the frequency discriminator 33 is simply switched off as soon as more accurate phase lock is obtained from VCO 28.

While the AFC of frequency discriminator 33 holds the VCO 28 close to (but not exactly on) the correct frequency, the mixer 34 generates a signal which contains features that permit precise carrier lock, as well be shown below. This signal is used for two purposes: it is sent into a conventional edge detecting clock recovery circuit 35 from which the clock reference signal of the data stream is recovered, and it is also mixed in a further mixer 36, with a square wave at half the clock signal frequency which comes from the clock recovery circuit 35.

The output of mixer 36 is a slowly varying signal which is added to the control signal of the frequency discriminator 33 in a summing network 37.

Once lock is achieved and the control signal of frequency discriminator 33 is disabled, the output of mixer 36 alone controls the VCO 28. It will be shown next that the output of mixer 36 controls the VCO 28 in such a way that VCO 28 is phase locked to the incoming carrier $\omega_c$.

In order to show that from random data the circuit of FIG. 2 generates a spectrum with a line to which an oscillator can be locked, it will be necessary to follow the signal in FIG. 2 from point A to points I and Q, to point B and then to point C, using the equations for the signals at these points. To derive these equations, higher frequency components are ignored, as is usual in the description of down converter circuits.

At point A, a Fast FSK signal $s_A(t)$ arrives, with carrier of angular frequency $\omega_c$ and angular frequency deviation $\pm \pi h/T$ ($h=\frac{1}{2}$ for Fast FSK) and unknown phase $\phi(n)$ at the start of the nth bit interval, $t=n$. This signal $\omega_c \pm \pi h/T/\phi(n)$, is in detail:

$$s_A(t) = \cos[(\omega_c \pm \pi h/T)t + \phi(n)] \quad (1)$$

where $$\phi(n) = \phi_o \text{ or } = \phi_o + \pi \quad (2)$$

$$\phi_o = \phi(0)$$

T = duration of one bit
t = time

Which of the two values $\phi(n)$ takes depends on the history of the data. This 180° ambiguity is typical for a Fast FSK signal with random data.

This signal is hard limited in limiter 21, which destroys all amplitude information and retains only the zero crossings and is then split into two paths where it is down converted twice in each path by mixers 22,26 and 23,27, respectively. The first down conversion being with a fixed reference $\omega_1/\gamma$, where $\gamma=0$ in the one path and $\gamma=\pi/2$ in the other path, and the second down conversion being with the output $\omega_2/\beta$ of the voltage-controlled osassociated with each mixer. The usual formulas for converting apply, namely:

$2 \cos x \cos y = \cos(x-y) + \text{higher frequency terms}$.

Assume, without loss of generality, $\omega_1 > \omega_c$. Then in the first down-conversion:

$$2\cos[\omega_c t \pm \pi h/T + \phi(n)]\cos(\omega_1 t + \gamma) = \cos[(\omega_1 - \omega_c)t \mp \pi h/T + \gamma - \phi(n)] + \text{higher frequency terms} \quad (3)$$

The higher frequency terms may be removed by either a filter in each path which are not shown in FIG. 2, or by a frequency plan that in effect prevents the higher frequency terms from interfering with the second down converter.

Assume now that the VCO 28 is sufficiently close to lock-on frequency, so that:

$$|\omega_1 - \omega_c - \omega_2| < \pi h/T \quad (4)$$

This condition is enforced by the AFC loop using frequency discriminator 33 which ensures that the frequencies $f_1$ and $f_2$ when mixed result in a frequency between $f_s$ and $f_m$. This is identical with the condition expressed by equation (4), because:

$$2\pi f_s = \omega_c + \pi h/T$$

and $$2\pi f_m = \omega_c - \pi h/T$$

Down-converting a second time with the output of VCO 28 at $\omega_2/\beta$ gives a low frequency component that will be rewritten so as to show a positive frequency, assuming equation (4) to be fulfilled:

$$2\cos[(\omega_1 - \omega_c)t \mp \pi h/T + \gamma - \phi(n)]\cos(\omega_2 t + \beta) \quad (5)$$

$$= \cos[(\omega_1 - \omega_c - \omega_2)t \mp \pi h/T + \gamma - \phi(n) - \beta] +$$

higher frequency terms $$= \cos\{\pi h/T \mp [(\omega_1 - \omega_c - \omega_2)t - (\phi(n) + \beta - \gamma)]\} \quad (6)$$

after filtering by the low pass filters 29 and 30.

Following the usual nomenclature, the upper path is identified by I (in-phase) and the lower path by Q (quadrature). The above equation (6) is valid for signals in FIG. 2 at points:

I with $\gamma=0°$; and

Q with $\gamma=90°$.

Both I and Q signals are hard limited in limiters 31 and 32, respectively, and then fed to frequency discriminator 33 and mixer 34. The frequency discriminator 33 is a coarse AFC to set the VCO 28 initially into the desired frequency range as in equation (4), thus reducing the initial frequency offset of the loop before it is locked. The mixer 34 is used as a control for VCO 28. It is noted that in equation (6), $\gamma=0$ for signal I and $\gamma=\pi/2$ for signal Q, but otherwise signals I and Q have identical terms; and in view of the trigonometric equations:

$$\cos(x \mp \pi/2) = \pm \sin x$$

and $$\pm 2 \sin x \cos x = \pm \sin 2x$$

the output of mixer 34 at point B of FIG. 2 is (except for harmonics):

$$s_B = \pm \sin\{2\pi h t/T \mp [2(\omega_1 - \omega_c - \omega_2)t - 2(\phi(n) + \beta)]\} \quad (7)$$

where of $\pm$ and $\mp$ either both the upper or both the lower signs are to be taken.

Thus, with one logic circuit (i.e. one exclusive OR), frequency doubling has been effectively achieved. This is evident by the destruction of the 180° ambiguities of $\phi(n)$, since, irrespective of the data, $2[\phi(n)+\pi] \equiv 2\phi(n) \equiv 2\phi_o \pmod{2\pi}$. The frequency-doubled signal $s_B$ can be rewritten with this and $2h=1$:

$$s_B = \pm \sin\{\pi t/T \mp [2(\omega_1 - \omega_c - \omega_2)t - 2\beta - 2\phi_o]\} \quad (8)$$

It is possible to frequency demodulate the signal at B; the clock recovery circuit 35 essentially does this, then locates the edges of the data stream pulses and provides a clock signal locked to the edges. This conventional circuit is in effect fourth order nonlinear, and therefore takes longer in providing the clock signal than would a second order non-linear circuit. However, the edge locating non-linear circuit has the advantage of requiring much slower gates, and hence it is easier and less power-consuming to implement with standard CMOS technology.

As described earlier, clock recovery circuit 35 derives from the data edges a square wave at half the clock signal frequency $1/T$. This square wave $s_R$ is fed to mixer 36 where it is mixed with signal $s_B$. The signal $s_R$ (except for harmonics) is:

$$s_R = \cos(\pi t/T) \quad (9)$$

Multiplying $s_R$ and $s_B$ and using the identity $$2 \cos x \sin y = -\sin(x-y) + \sin(x+y)$$

gives signal $s_C$ at the output of mixer 36, point C.

$$s_C = 2\cos(\pi t/T) \cdot s_B \quad (10)$$
$$= -\sin[2(\omega_1 - \omega_c - \omega_2)t - 2\beta - 2\phi(0)] +$$

higher frequency terms

The higher frequency terms are removed by filters in the conventional manner.

The frequency discriminator 33 is disabled as soon as lock occurs. Then the signal $s_C$ above controls the frequency of the VCO 28, and the frequency control loop for VCO 28 is closed. If the VCO 28 loop is stable, then the error signal $s_C$ is nulled at all times. Hence at phase lock for VCO 28:

$$\omega_2 = \omega_1 - \omega_c \quad (11)$$

and $$-2\beta = 2\phi(0) \pmod{\pi} \quad (12)$$

That is, it is not necessary to have the VCO itself at double frequency when locking it to the frequency-doubled signal, because with the arrangement described here the VCO is at fundamental frequency, mixed in both the I channel and the Q channel at fundamental frequency, and the frequency difference between the Fast FSK signal and the VCO output is in effect frequency doubled in mixer 34, which produces signal $s_B$. Thus we do not need to show self-synchronization with circuits "equivalent" to frequency doubling, since we have achieved the required frequency doubling with the novel circuit arrangement.

The essence of the function of this self-synchronization circuit is thus, that firstly, the incoming signal generates two i.f. signals that are in phase quadrature and part of a phase-locked loop which provides the carrier reference through VCO 28; secondly, that the product of these two signals is taken in the mixer 34. This nonlinear action results in frequency doubling according to the identity $2 \sin \omega t \cos \omega t = \sin 2\omega t$. And thirdly, that the frequency doubling generates spectral lines from which carrier phase and clock reference signals can be recovered.

The product of the signals can be taken by various circuits that provide multiplication of the I and Q signals. For example, if the two quadrature signals are analog signals and free of d.c., then a balanced modulator is a good choice. If the signals are binary, i.e. switched between two logic levels, then an "exclusive OR" of the two signals provides a logic product that frequency doubles.

Once frequency doubling has been achieved, there are numerous known ways of extracting the two lines separately or jointly, with and without assistance from higher order nonlinearity circuits as, for instance, deriving the clock signal from locating the edges of the data stream pulses.

The circuit of FIG. 2 should thus be considered only as the preferred embodiment, adapted to a particular requirement whose analysis illustrates how it is not always immediately evident where frequency doubling occurs in the circuit.

Many modifications in the above described embodiment of the invention can be carried out without departing from the scope thereof and therefore, the scope of the present invention is intended to be limited only by appended claims.

We claim:

1. In a demodulating receiver, a self-synchronization circuit for generating a carrier reference signal from an incoming Fast FSK or MSK signal comrising:

first means for splitting the incoming signal into two circuit paths;

second means for frequency shifting the incoming signal in each circuit path by a frequency signal substantially equal to the carrier frequency to provide an in-phase signal along one circuit path and a quadrature phase signal along the other circuit path, the frequency shifting means having an oscillator circuit controllable in frequency and phase;

first multiplier means for multiplying the in-phase and quadrature signals;

clock recovery circuit means for determining the clock frequency from the output of the first multiplier means; and second multiplier means for multiplying the output of the first multiplier means and the clock recovery circuit means for providing a carrier phase signal to the controllable oscillator circuit.

2. A self-synchronization circuit as claimed in claim 1 which further includes a frequency discriminator means controlled by the in-phase and quadrature signals for initially controlling the oscillator circuit frequency.

3. A self-synchronization circuit as claimed in claims 1 or 2 wherein the second means includes third mixer means in the one circuit path and fourth mixer means in the other circuit path, the third mixer means having a first input connected to the first means and an output connected to the first multiplier means, the fourth mixer means having a first input connected to the first means and an output connected to the multiplier means, and means for providing signals from the controllable oscillator circuit to a second input of the third mixer means and a second input of the fourth mixer means wherein the signal to the third mixer means is shifted 90° with respect to the signal to the fourth mixer means.

4. A self-synchronization circuit as claimed in claims 1 or 2 wherein the second means includes:

third mixer means in the one circuit path and fourth mixer means in the other circuit path, the third mixer means having a first input and a second input, and an output connected to the first mixer means, the fourth mixer means having a first input and a second input, and output connected to the first mixer means; and means for providing signals from the controllable oscillator circuit to the second input of the third mixer means and the second input of the fourth mixer means;

fifth mixer means having a first input connected to the first means and an output connected to the first input of the third mixer means, and sixth mixer means having a first input connected to the first means and an output connected to the first input of the fourth mixer means; and fixed oscillator means having a frequency greater than the carrier frequency for providing a signal to a second input of the fifth mixer means and a signal to a second input of the sixth mixer means shifted by 90° with respect to the signal provided to the fifth mixer means.

* * * * *